(12) United States Patent
Goodman et al.

(10) Patent No.: US 11,287,728 B2
(45) Date of Patent: Mar. 29, 2022

(54) OUTDOOR ENCLOSURE WITH TEMPERATURE PROTECTION MEANS FOR A SMART CAMERA

(71) Applicant: CTY, Inc., Brooklyn, NY (US)

(72) Inventors: Ilan Nathan Goodman, White Plains, NY (US); Tara Pham, Brooklyn, NY (US); Peter Fallon, Tarrytown, NY (US); Dean Francis DiPietro, Brooklyn, NY (US)

( * ) Notice: Subject to any disclaimer, the term of this patent is extended or adjusted under 35 U.S.C. 154(b) by 115 days.

(21) Appl. No.: 16/815,634

(22) Filed: Mar. 11, 2020

(65) Prior Publication Data

US 2020/0292919 A1 Sep. 17, 2020

Related U.S. Application Data

(60) Provisional application No. 62/818,849, filed on Mar. 15, 2019.

(51) Int. Cl.
*G03B 17/55* (2021.01)
*G03B 17/08* (2021.01)
(Continued)

(52) U.S. Cl.
CPC ............. *G03B 17/55* (2013.01); *G03B 17/08* (2013.01); *G08B 13/19617* (2013.01);
(Continued)

(58) Field of Classification Search
CPC ...... G03B 17/55; G03B 17/561; G03B 17/02; G03B 17/08; G03B 2217/002; G03B 2217/007; G03B 2206/00; H04N 5/22521; H04N 5/2251; H04N 5/2252; H04N 5/2253; H04N 5/2254; H04N 5/2257; G06F 1/20; G06F 1/203; G06F 1/206; H05K 1/0201; H05K 1/0203; H05K 1/0204;
(Continued)

(56) References Cited

U.S. PATENT DOCUMENTS

| 6,072,697 A * | 6/2000 | Garcia-Ortiz | H05K 7/20163 165/46 |
| 6,449,431 B1 * | 9/2002 | Cuddeback | A01M 31/002 396/27 |

(Continued)

OTHER PUBLICATIONS

Wikipedia Encyclopedia, Heat Sink (definition), first two paragraphs of first page, Wayback Machine Snapshot Date Jul. 29, 2016 Web Address: https://en.wikipedia.org/wiki/Heat_sink.*

*Primary Examiner* — Twyler L Haskins
*Assistant Examiner* — Akshay Trehan
(74) *Attorney, Agent, or Firm* — Jason Plotkin; Tod Melgar

(57) ABSTRACT

An enclosure for an outdoor smart camera includes an environmentally sealed main housing with a core formed by a hollow heatsink. The heatsink runs through the interior of the housing with openings on either end of the heatsink to allow airflow. Heat emitting electronics inside the sealed main housing are mounted directly to the heatsink to conduct the heat passively through the heatsink to the external environment. The heatsink and main housing can be cut to any desired length to adjust the size of the enclosure and accommodate variable size and quantity of internal components. Mounting slots are included for mounting the enclosure easily to poles and other structures.

20 Claims, 5 Drawing Sheets

(51) Int. Cl.
  *G03B 17/56* (2021.01)
  *H04N 5/225* (2006.01)
  *G08B 13/196* (2006.01)
  *H05K 7/20* (2006.01)
  *F16M 13/02* (2006.01)
  *A01M 31/00* (2006.01)

(52) U.S. Cl.
  CPC ..... *G08B 13/19632* (2013.01); *H04N 5/2252* (2013.01); *H04N 5/2253* (2013.01); *H04N 5/2257* (2013.01); *H04N 5/22521* (2018.08); *H05K 7/20* (2013.01); *H05K 7/2039* (2013.01); *A01M 31/002* (2013.01); *F16M 13/02* (2013.01); *G03B 17/561* (2013.01); *G03B 2206/00* (2013.01); *G03B 2217/007* (2013.01)

(58) Field of Classification Search
  CPC .... H05K 1/0207; H05K 1/0209; H05K 1/021; H05K 5/00; H05K 5/0039; H05K 5/0043; H05K 5/0056; H05K 5/0073; H05K 5/02; H05K 5/06; H05K 7/20; H05K 7/20009; H05K 7/20127; H05K 7/20163; H05K 7/202; H05K 7/2039; H05K 7/20409; H05K 7/20418; H05K 7/205; G08B 13/196; G08B 13/19632; G08B 13/19617; G08B 13/19619; G08B 13/19621; B60R 11/04; F16M 11/02; F16M 11/04; F16M 13/00; F16M 13/02; F16M 13/022; F16M 2200/00; F16B 1/00; F16B 2/00; F28F 1/00; F28F 9/00; F28F 9/001; F28F 9/007; F28F 9/013; F28F 9/0138; A01M 31/002; B62J 11/00

USPC .................................................. 348/373, 374
  See application file for complete search history.

(56) References Cited

U.S. PATENT DOCUMENTS

| | | | | |
  |---|---|---|---|---|
  | 7,471,334 B1* | 12/2008 | Stenger | .................. | G03B 29/00 348/373 |
  | 2005/0184386 A1* | 8/2005 | Suzuki | .................. | G03B 17/55 257/706 |
  | 2006/0285226 A1* | 12/2006 | Senba | .................. | G02B 7/008 359/694 |
  | 2009/0237537 A1* | 9/2009 | Maruyama | ............. | G03B 17/02 348/294 |
  | 2010/0060747 A1* | 3/2010 | Woodman | ........ | H04N 5/225251 348/222.1 |
  | 2011/0108250 A1* | 5/2011 | Horng | ....................... | G06F 1/28 165/121 |
  | 2014/0168507 A1* | 6/2014 | Renaud | .................. | G03B 17/55 348/373 |
  | 2015/0003908 A1* | 1/2015 | Hoffmann | .............. | G03B 17/02 404/9 |
  | 2015/0049243 A1* | 2/2015 | Samuels | ................ | G03B 17/55 348/374 |
  | 2015/0195442 A1* | 7/2015 | Pacurariu | ........... | H04N 5/23203 348/211.2 |
  | 2015/0195952 A1* | 7/2015 | Tsunoda | ............. | H05K 7/20163 361/697 |
  | 2016/0066476 A1* | 3/2016 | Gu | ............................ | F28F 3/02 361/715 |
  | 2017/0126936 A1* | 5/2017 | Saha | ...................... | F16M 13/02 |
  | 2017/0131621 A1* | 5/2017 | Tang | ...................... | B64D 47/08 |
  | 2017/0331996 A1* | 11/2017 | Bull | ............................ | G03B 5/00 |
  | 2019/0028617 A1* | 1/2019 | Odom | .................. | G03B 17/08 |
  | 2019/0373765 A1* | 12/2019 | Naito | .................... | H04N 9/3144 |
  | 2020/0186763 A1* | 6/2020 | Chen | ...................... | G03B 21/16 |

* cited by examiner

OUTDOOR ENCLOSURE WITH TEMPERATURE PROTECTION MEANS FOR A SMART CAMERA

PRIORITY CLAIM

Applicant hereby claims priority under 35 USC § 119 to provisional U.S. patent application Ser. No. 62/818,849, filed Mar. 15, 2019, entitled "Outdoor Enclosure for a Smart Camera."

The entire contents of the aforementioned applications are herein expressly incorporated by reference.

BACKGROUND

Operating a camera in an outdoor environment requires special consideration of the enclosure design to ensure that the camera and related circuitry and other components are kept clean and dry regardless of the weather and other ambient conditions. The problem is especially challenging when dealing with "smart cameras", wherein a computer processor is co-located with the camera in order to perform intensive computations on the camera images or video. In that case, a significant amount of heat may be generated by the processor itself as well as the camera, and the heat must be dissipated from the enclosure to avoid damaging the electronics and other components. The heat problem is further exacerbated if other heat-emitting electronics are included, such as other types of sensors, and communication equipment such as modems and WiFi transceivers.

Traditional solutions rely on the use of one or more fans to blow air past the heat emitting electronics which is then vented outside of the device. This approach has two main problems: first, the need to maintain air flow requires having vents in the enclosure for air to enter and exit; this precludes having any real environmental seal, since a vent that can allow air flow is also susceptible to dust, moisture, and corrosive gases that could damage the camera and electronics. Second, the fans themselves are prone to failure, which shortens the overall lifespan of the device. Other solutions involve integrating a heatsink into the enclosure such that the heatsink forms a substantial and noticeable part of the enclosure itself, driving up the cost and weight of the enclosure, lessening the performance of any radio transceivers that may be housed inside the enclosure, and limiting the possibilities for aesthetic design.

SUMMARY

The present innovation solves these problems through a novel mechanical design. Notably, this enclosure is able to cool the internal electronics through passive heat dissipation without venting, allowing us to create a complete environmental seal to protect the internal components without compromising on the physical or aesthetic arrangement of the enclosure. The design offers additional advantages over traditional Page 3 of 7 enclosure designs, in that it is easy to manufacture, and can be easily scaled in manufacturing to accommodate different sizes and amounts of internal components as well as provide more or less cooling efficiency, depending on the needs of any given set of cameras, processors, and other components. Finally, the unique design of the enclosure makes it easy to attach to any pole, such as a light pole or traffic signal pole, or the side of any building or other structure.

The enclosure disclosed herein is based in part on the idea that electronic components can often be effectively cooled using a passive heatsink device—usually made of aluminum or some other metal that conducts heat efficiently—if the heat can be transferred to the heatsink effectively, and if the heatsink can in turn transfer that heat efficiently to the ambient environment. Accomplishing this in an environmentally sealed enclosure requires that at least one side of the heatsink makes contact with the ambient environment, external to the enclosure, while at least one other side is in direct contact with the heat emitting components internal to the enclosure. One way to accomplish this is to make the enclosure itself either partially or completely out of aluminum, and mount the internal components directly to the enclosure. However, this is often impractical for several reasons: The cost or weight may be prohibitive, especially if the enclosure needs to be large to accommodate the internal components; an aluminum enclosure is not appropriate if radio transceivers are included in the internal components, as it would interfere with radio signals; and this approach limits the aesthetic possibilities of the housing design, as the heat dissipating elements of the housing become large, externally visible components of the overall enclosure design.

Instead, this disclosure uses a novel internal heatsink to create a hollow core that runs through the length of the sealed enclosure, allowing air to pass across the heatsink features through natural convection while fully sealing the internal components from the environment. The outer housing body can be made of any material, for example, PVC, having whatever aesthetic and functional properties are desired, such as low radio interference, low cost, low weight, and smooth uninterrupted exterior surface. The heatsink core is a hollow tube, preferably with internal fins or other features to increase the thermal conductivity of the heat sink by maximizing the surface area in contact with the air. This tube can preferably be constructed through a process of metal extrusion, and cut to whatever length is required. The cross-sectional shape of the heatsink can be selected to fit precisely the shape of the housing body. For example, a semi-circular cross section could be used to fit inside a circular body, and a rectangular cross section could be used to fit inside a rectangular body. In this way, both the heatsink and the housing body can be constructed by extrusion and cut to any length, allowing easy mass production even where different sized enclosures are needed to meet different requirements. This linear design also gives the enclosure modularity; multiple housing segments with the same cross-section can be stacked, allowing easy post-production extension of the housing, for example in order to co-locate multiple cameras at a single installation point.

Since it runs through the length of the housing body, the heatsink also serves a secondary purpose of being the main structural member for the enclosure, adding strength and durability to the enclosure without requiring any additional support structure. Internal heat-generating components are mounted directly to the heatsink, preferably using a thermal conducting paste or silicone thermal pad to efficiently transfer heat from the component to the heatsink. Other components can be mounted directly or indirectly along the length of the heatsink. The housing body and heatsink are together sandwiched between a top cap and a collar, which may also be made of aluminum or other materials such as plastic. The top cap and collar each include an opening to allow airflow through the heatsink, but are sealed around the housing body and around the heatsink using gaskets, o-rings, silicone, or some other sealant. The top and bottom caps may include additional features to make it easy to mount to a pole or building, for example by passing steel straps through mounting slots built into the cap and collar.

While the disclosure above and the detailed disclosure below are presented herein in the context of outdoor enclosure for a camera, it will be understood by those of ordinary skill in the art that the concepts may be applied to other types of enclosure for electronics or other heat generating equipment and in various ways where there is a beneficial advantage to seal components from the external environment while providing adequate heat dissipation. With the foregoing overview in mind, specific details will now be presented, bearing in mind that these details are for illustrative purposes only and are not intended to be exclusive.

BRIEF DESCRIPTION OF THE DRAWINGS

The accompanying drawings illustrate various non-limiting examples and innovative aspects of the outdoor enclosure in accordance with the present description.

DETAILED DESCRIPTION

Figure 1:
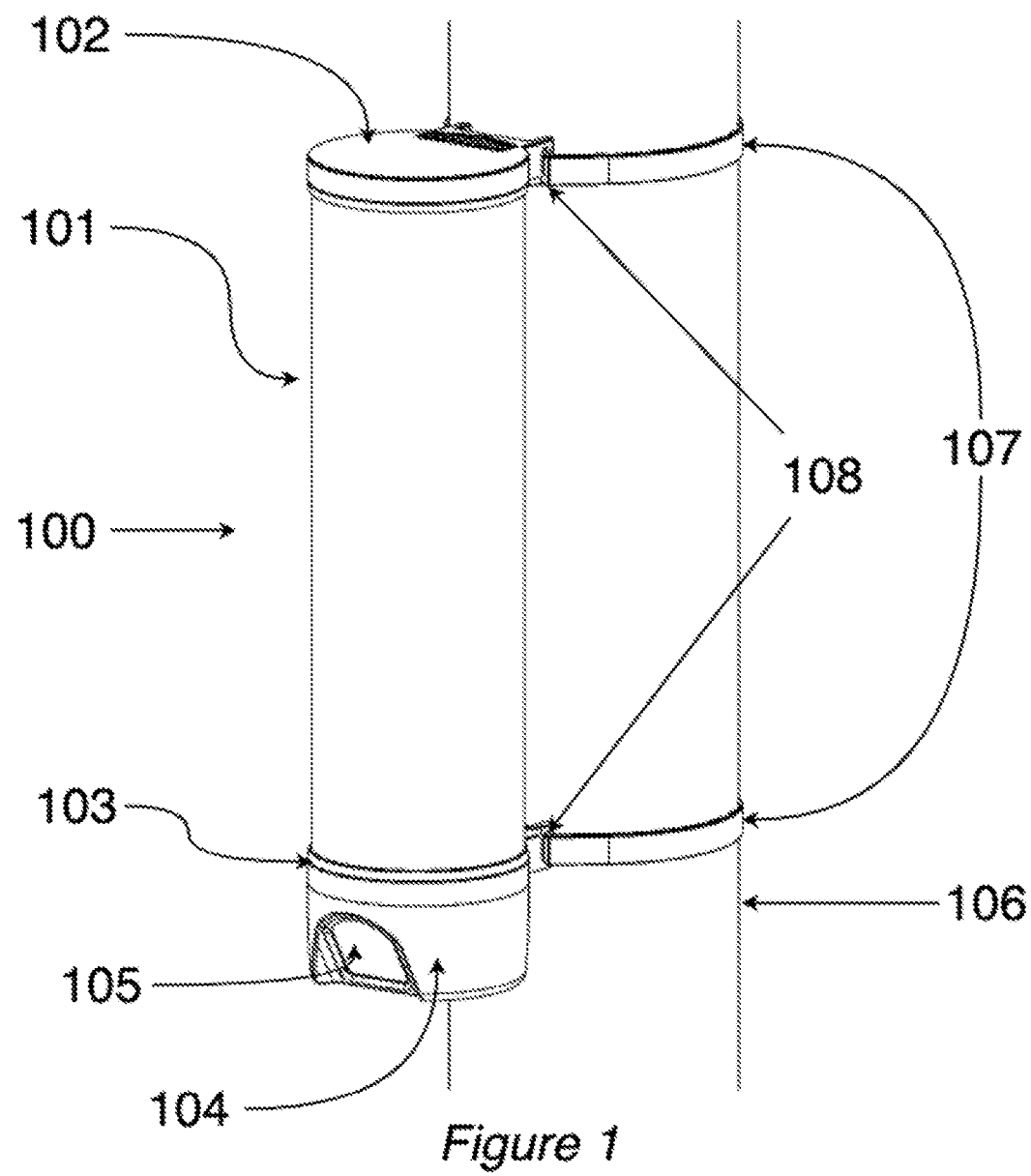
FIG. 1 is a perspective view of the one embodiment of an outdoor enclosure for a smart camera mounted to a pole.

An embodiment of the outdoor enclosure for a smart camera 100 is shown in FIG. 1. The main external housing consists of a cylindrical body 101, a top cap 102, a collar mount 103, and a bottom cap 104. The body 101 may made of any material capable of sealing internal components from the external environment, including extruded plastic such as PVC or ABS that has limited radio frequency interference. The top cap 102 and collar mount 103 may also be made of a rigid material and preferably a high strength material such as cast or machined aluminum, giving the overall housing additional strength when mounted on a pole or building. The bottom cap 104 may similarly be made of any rigid or semirigid material plastic, which can be injection molded or 3D printed. The bottom cap also includes a transparent lens cover 105 which is preferably made of glass or optical grade PMMA, and is large enough to accommodate the entire camera field of view without obstruction. Lens cover 105 may also be chemically coated to reduce glare and reflections to ensure the camera can obtain high quality images in all lighting conditions. The enclosure is easily mounted to a pole 106 such as a light pole or traffic signal pole using steel hose clamps 107 passed through mounting slots 108 on the top cap and collar mount.

Figure 2:
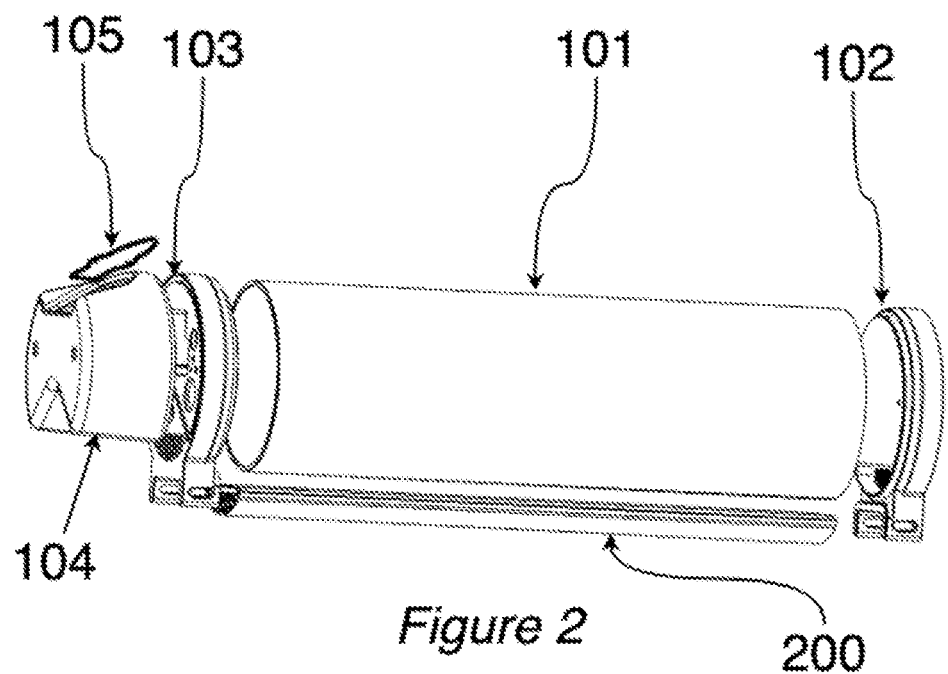
FIG. 2 is an exploded view of the enclosure.
Figure 3:
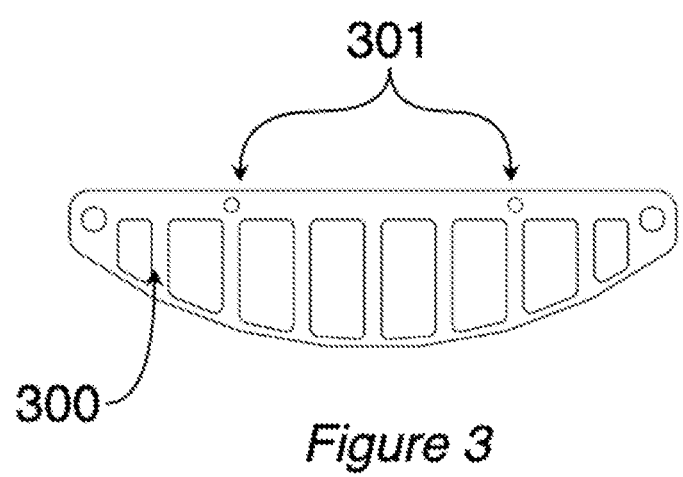
FIG. 3 is a cross-sectional view of the heatsink.

The exploded view of FIG. 2 shows how the main housing components go together. This view also reveals the heatsink 200 which fits between the top cap 102 and collar mount 103 and is hidden inside the body 101 when assembled. The heatsink is preferably made of aluminum by extrusion. A cross-section of the heatsink is shown in FIG. 3. The fins 300 run the full length of the heatsink, maximizing the surface area for heat transmission while leaving sufficient room for good air flow through the heatsink. Screw holes 301 at one end are used to secure the heat sink to the collar mount with machine screws 702 which are visible in FIG. 7.

Figure 4:
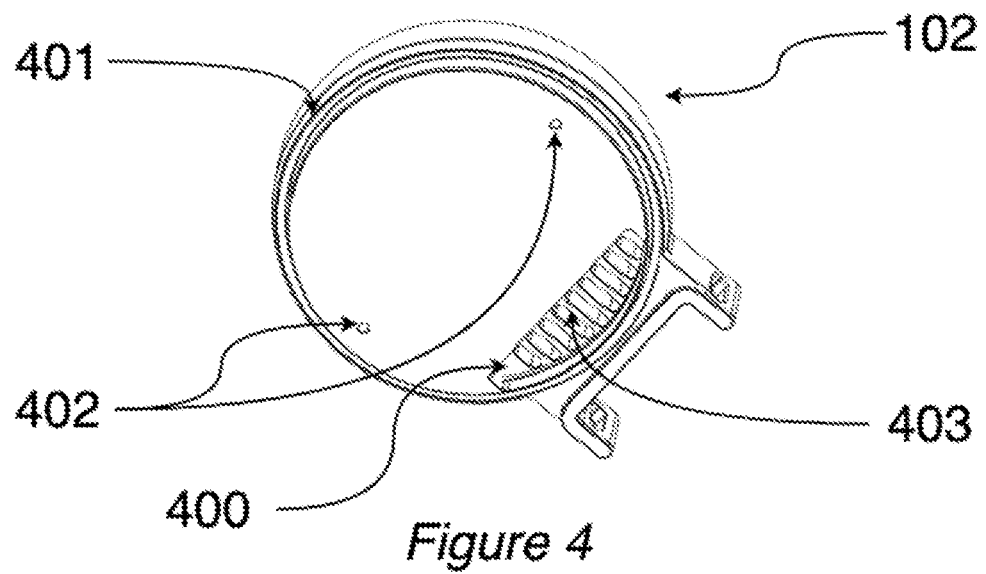
FIG. 4 is a perspective view of the top cap.
Figure 5:
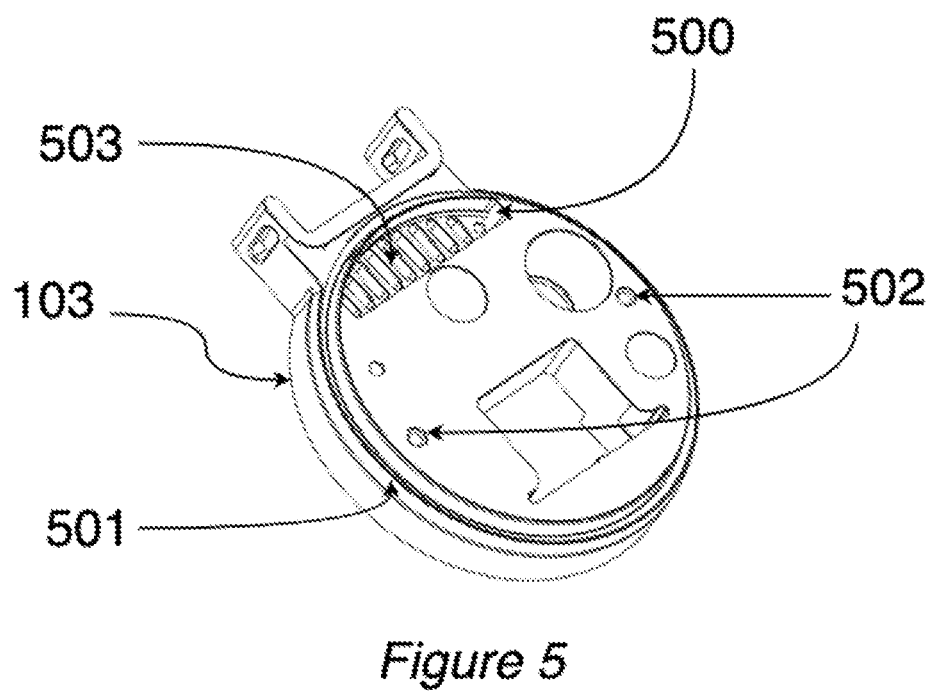
FIG. 5 is a perspective view of the collar mount.
Figure 6:
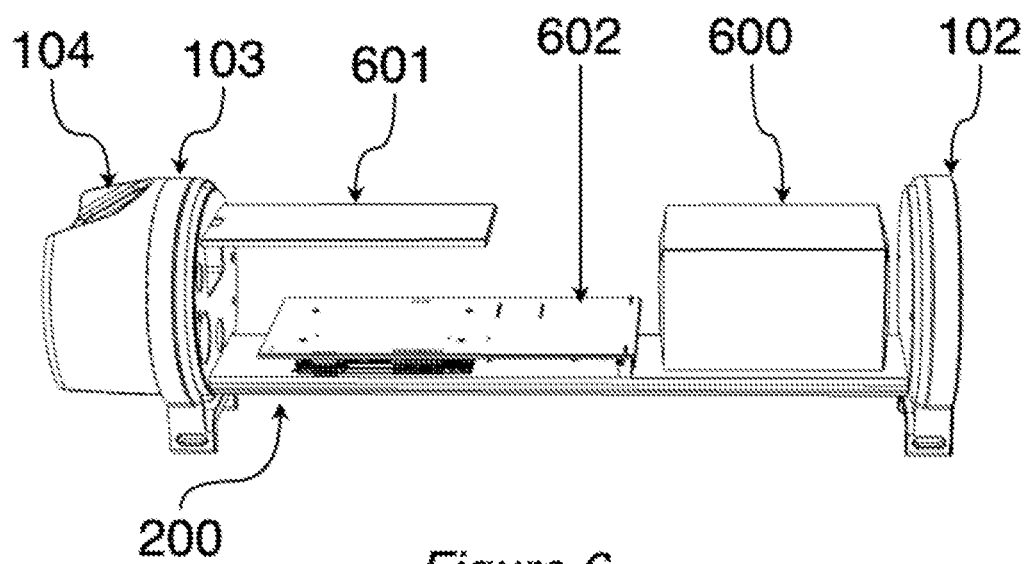
FIG. 6 is a side view of the enclosure with the body hidden, showing the internal components.
Figure 7:
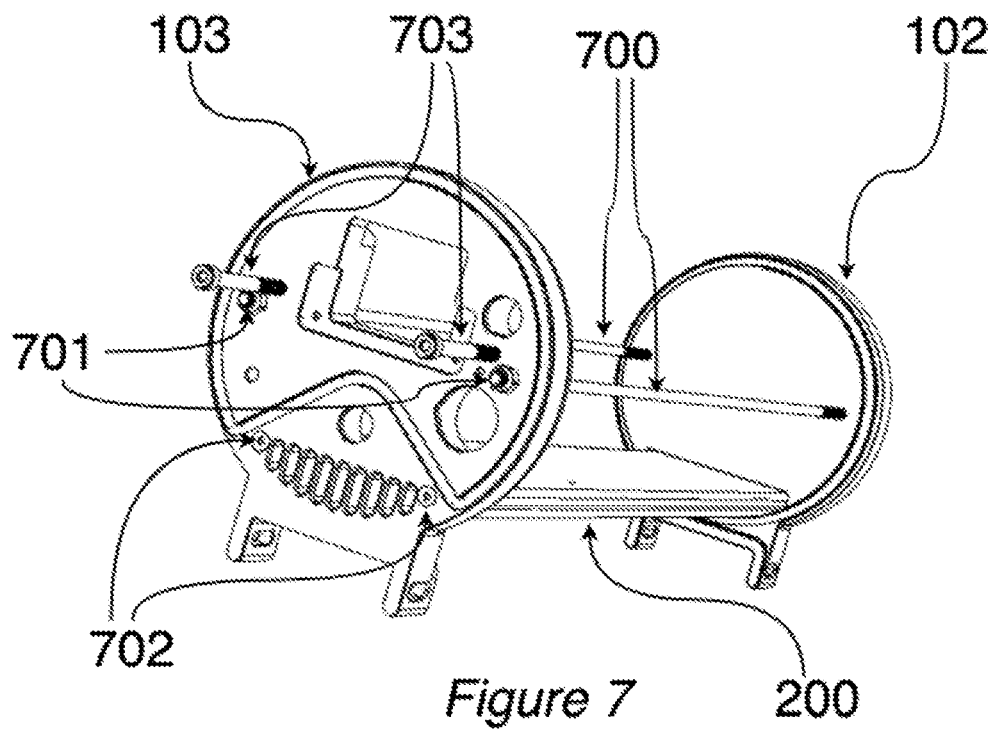
FIG. 7 is a perspective view of the enclosure with the body and bottom cap hidden to reveal the overall assembly.

The top and bottom of the heatsink fit into grooves 400 and 500 in the top cap 102 and collar mount 103, shown respectively in FIG. 4 and FIG. 5. The body 101 mates to both the top cap 102 and collar mount 103, forming seals with gaskets 401 and 501. The gaskets are preferably made of rubber or silicone, and may be pre-formed or formed in place using a UV cured liquid silicone gel. Grates 403 and 503 allow air flow through the heatsink while protecting it from debris. As can be seen in FIG. 7, the entire assembly is held together using threaded rods 700 inserted through holes 502 in the collar mount, screwed into threaded holes 402 in the top cap, and secured with steel locknuts 701. Bottom cap 104 is attached to collar mount 103 using screws 703. Internal components are mounted directly to the heatsink 200 as shown in FIG. 6. Heat generating components such as a processor board 602 are mounted using a thermal conductive paste such as silicone CPU grease. Heat is passively conducted into the heatsink 200, where it is in turn conducted to the air from fins 300. Air flows freely through the heatsink 200 via grates 403 and 503, allowing the heat to dissipate into the ambient environment. Components that do not need heat conduction, or components such as radio antennae that should not be placed near aluminum or other metals, are mounted on a separate mounting mast 601 that is preferably made of plastic.

Figure 8:
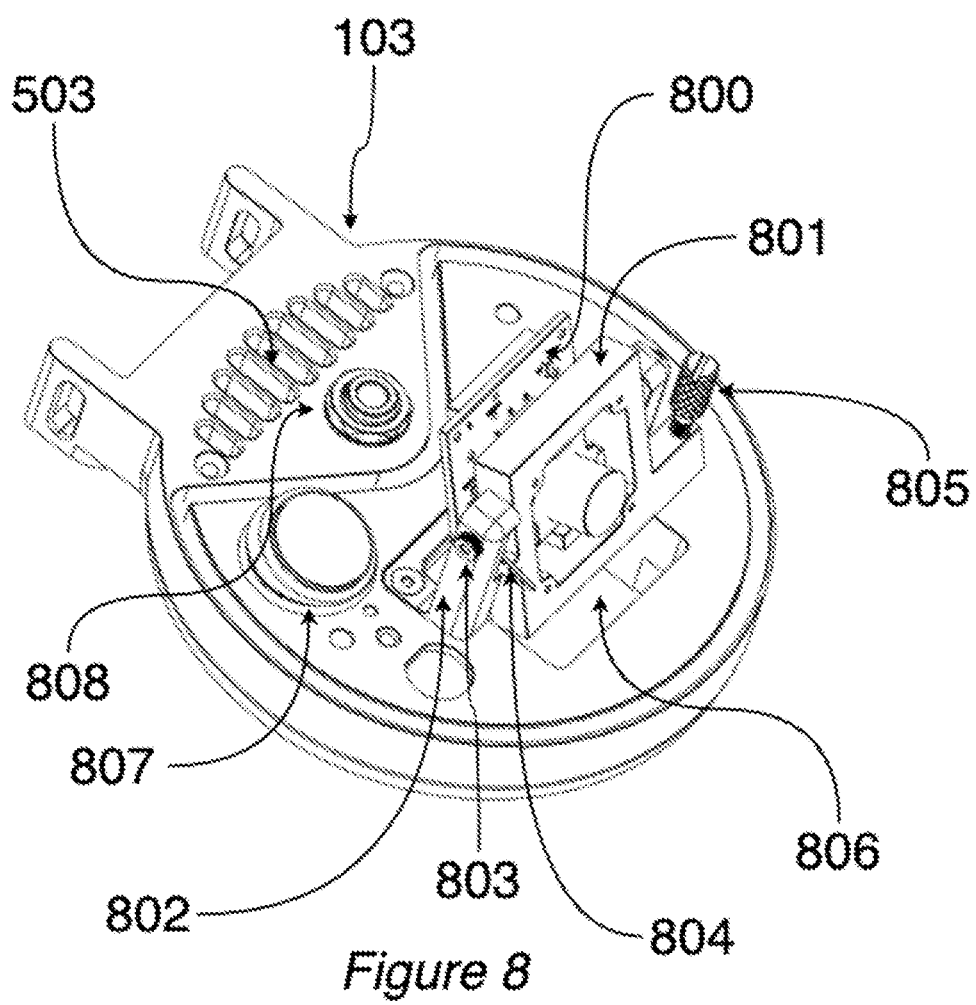
FIG. 8 is perspective view of the collar mount with the camera sub-assembly attached.

As can be seen in FIG. 8, the camera sub-assembly 800 is attached to camera mount 801, which in turn is connected to camera yoke 802 using dowel pins 803 or shoulder bolts. Resistance is provided by wire torsion spring 804, holding the camera's vertical tilt in place. Tilt is adjusted by tightening or loosening set screw 805. The entire assembly is mounted on collar mount 103. The camera is connected to processor board 602 by passing a cable through hole 806. Power switch 807 and power jack 808 are also attached to collar mount 103.

It should be understood that this description (including the figures) is only representative of some illustrative embodiments. For the convenience of the reader, the above description has focused on representative samples of all possible embodiments, and samples that teach the principles of the disclosure. The description has not attempted to exhaustively enumerate all possible variations. That alternate embodiments may not have been presented for a specific portion of the disclosure, or that further undescribed alternate embodiments may be available for a portion, is not to be considered a disclaimer of those alternate embodiments. One of ordinary skill will appreciate that many of those undescribed embodiments incorporate the same principles of the disclosure as claimed and others are equivalent.

What is claimed is:

1. An environmental housing comprising:
    an elongated body portion having a hollow core and extending from a lower end to an upper end of the body portion;
    an elongated heat sink portion in physical communication with the elongated body portion and extending from proximate the lower end of the body portion to proximate the upper end of the body portion, wherein the elongated heat sink portion is adapted to receive components in thermal communication with the heat sink portion;
    a top cap adapted to cover and seal an open upper end of the body portion;
    a collar mount adapted to cover an open lower end of the body portion; and wherein the collar mount has an adjustable camera mount, a power jack and power switch.

2. The environmental housing of claim 1, wherein the elongated heat sink portion is a hollow body having a plurality of internal fins.

3. The environmental housing of claim 1, wherein:
the elongated heat sink portion is a hollow body;
the top cap includes a grate portion adapted to cover an open upper end of the heat sink portion hollow body; and
the collar mount includes a grate portion adapted to cover an open lower end of the heat sink portion hollow body.

4. The environmental housing of claim 1, wherein the top cap includes mounting slots adapted to receive a first band for securing the housing to a pole.

5. The environmental housing of claim 4, wherein the collar mount includes mounting slots adapted to receive a second band for securing the housing to a pole.

6. The environmental housing of claim 1, further comprising a bottom cap configured to cover the camera mount.

7. The environmental housing of claim 6, wherein one of the collar mount or the bottom cap seal the core of the body portion from the environment.

8. The environmental housing of claim 1, wherein the body portion is composed of plastic and the heat sink portion is composed of metal.

9. The environmental housing of claim 8, wherein the body portion is composed of one of PVC or Acrylonitrile Butadiene Styrene.

10. The environmental housing of claim 8, wherein the heat sink portion is composed of aluminum.

11. The environmental housing of claim 1, further comprising at least two rods configured to extend from the top cap to the collar mount, and secure at least one of the top cap and collar mount to the body portion.

12. The environmental housing of claim 1, wherein at least one of the top cap or collar mount further have a mounting mast extending from a cover portion, adapted to cover and seal an open upper end of the body portion, and into the hollow core of the elongated body portion.

13. The environmental housing of claim 1, further comprising a separate mounting mast, made out of plastic, and the separate mounting mast is located within the body portion but far from other metal components.

14. The environmental housing of claim 13, wherein components that cannot be placed near other metal components, including a radio antennae, are mounted to the separate mounting mast.

15. An environmental housing comprising:
an elongated body portion having a hollow core and extending from a lower end to an upper end of the body portion;
an elongated heat sink portion in physical communication with the elongated body portion and extending from the lower end of the body portion to the upper end of the body portion, and wherein the elongated heat sink portion is a hollow body having a plurality of internal fins extending along a length of the hollow body from a lower end toward an upper end, wherein a portion of the heat sink has an internal component mounting portion for receiving and mounting heat generating components and wherein the component mounting portion is disposed in the hollow core of the body portion;
a top cap having a cover portion adapted to cover and seal an open upper end of the body portion, an adjacent grate portion to cover an open upper end of the elongated heat sink portion, and an attachment portion adapted with slots to receive a first attachment band whereby the environmental housing can be attached to a pole;
a collar mount having a cover portion adapted to cover an open lower end of the body portion, an adjacent grate portion to cover an open lower end of the heat sink portion, an attachment portion adapted with slots to receive a second attachment band whereby the environmental housing can be attached to a pole; and
at least one of the top cap or collar mount further having a mounting mast extending from the cover portion and into the hollow core of the elongated body portion; and
wherein the collar mount has an adjustable camera mount, a power jack and power switch.

16. The environmental housing of claim 15, further comprising a bottom cap configured to cover the camera mount.

17. The environmental housing of claim 15, wherein the top cap and at least two of the collar mount, the bottom cap and the heat sink portion seal the core of the body portion from the environment.

18. The environmental housing of claim 15, further comprising at least two rods configured to extend from the top cap to the collar mount, and secure at least one of the top cap and collar mount to the body portion.

19. The environmental housing of claim 15, further comprising a separate mounting mast, made out of plastic, and the separate mounting mast is located within the body portion but far from other metal components.

20. The environmental housing of claim 19, wherein components that cannot be placed near other metal components, including a radio antennae, are mounted to the separate mounting mast.

* * * * *